(12) United States Patent
Rudhard et al.

(10) Patent No.: US 8,470,630 B2
(45) Date of Patent: Jun. 25, 2013

(54) METHOD FOR CAPPING A MEMS WAFER AND MEMS WAFER

(75) Inventors: Joachim Rudhard, Leinfelden-Echterdingen (DE); Thorsten Mueller, Reultingen (DE)

(73) Assignee: Robert Bosch GmbH, Stuttgart (DE)

( * ) Notice: Subject to any disclaimer, the term of this patent is extended or adjusted under 35 U.S.C. 154(b) by 130 days.

(21) Appl. No.: 13/056,186

(22) PCT Filed: Jun. 25, 2009

(86) PCT No.: PCT/EP2009/057989
§ 371 (c)(1),
(2), (4) Date: Feb. 8, 2011

(87) PCT Pub. No.: WO2010/012547
PCT Pub. Date: Feb. 4, 2010

(65) Prior Publication Data
US 2011/0127622 A1 Jun. 2, 2011

(30) Foreign Application Priority Data
Jul. 30, 2008 (DE) .......................... 10 2008 040 851

(51) Int. Cl.
*H01L 21/00* (2006.01)

(52) U.S. Cl.
USPC .............................................. 438/52; 438/58

(58) Field of Classification Search
USPC .................................................. 438/52, 55, 58
See application file for complete search history.

(56) References Cited

U.S. PATENT DOCUMENTS

2004/0248344 A1 12/2004 Partridge et al.
2005/0124089 A1 6/2005 Gogoi et al.

OTHER PUBLICATIONS

International Search Report corresponding to PCT Application No. PCT/EP2009/057989, mailed Nov. 5, 2010 (German and English language document) (5 pages).

*Primary Examiner* — Howard Weiss
*Assistant Examiner* — Steven Rao
(74) *Attorney, Agent, or Firm* — Maginot, Moore & Beck

(57) ABSTRACT

The invention relates to a method for capping a MEMS wafer (1), in particular a sensor and/or actuator wafer, with at least one mechanical functional element (10). According to the invention, it is provided that the movable mechanical functional element (10) is fixed by means of a sacrificial layer (14), and that a cap layer (19) is applied to, in particular epitaxially grown onto, the sacrificial layer (14) and/or to at least one intermediate layer (17) applied to the sacrificial layer (14). The invention also relates to a capped MEMS wafer (1).

18 Claims, 5 Drawing Sheets

METHOD FOR CAPPING A MEMS WAFER AND MEMS WAFER

BACKGROUND

The disclosure relates to a method for capping a MEMS wafer, in particular a sensor and/or actuator wafer, and to a capped MEMS wafer, in particular a sensor and/or actuator wafer.

Sensors using silicon technology are manufactured in a wide variety of processes nowadays. One technology successfully used by the applicant is so-called surface micromachining. After processing, the fragile and sensitive mechanical functional elements are protected against environmental influences by a capping at the wafer level. In this case, one successfully used technology is capping with a second separate wafer fixed to the sensor wafer by means of a seal glass connection. What is disadvantageous about the known capping technology using a capping wafer is that a system consisting of two wafers has a comparatively high construction. Furthermore, it is necessary to provide lateral reserves on the sensor wafer in order to be able to realize the seal glass connection between sensor wafer and cap wafer, which increases the area requirement of the wafer sensor.

The disclosure addresses the problem of proposing an alternative, improved capping method for MEMS wafers. Preferably, the end product of the method is intended to have a comparatively low construction and a comparatively small area requirement. Furthermore, the problem consists in proposing a MEMS wafer capped in a correspondingly optimized fashion.

Some of the known problems are solved by means of the features of claim 1 with regard to the capping method and by means of the features of claim 15 with regard to the MEMS wafer. Advantageous developments of the disclosure are specified in the dependent claims. All combinations of at least two of the features disclosed in the description, the claims and/or the figures fall within the scope of the disclosure. In order to avoid repetition, features disclosed in accordance with the method are also intended to be applicable and claimable as disclosed in accordance with the device. Likewise, features disclosed in accordance with the device are intended to be applicable and claimable as disclosed in accordance with the method.

The disclosure is based on the concept of realizing the capping at the MEMS wafer level by a combination of a sacrificial layer process with a cap layer process, wherein the cap layer is applied to, in particular epitaxially grown onto, either the sacrificial layer directly or at least one intermediate layer applied to the sacrificial layer. In the case where an epitaxially grown cap layer is realized, it is preferred to apply a start layer, preferably composed of polycrystalline silicon, either to the sacrificial layer directly or to an intermediate layer provided on the sacrificial layer, said start layer serving as a basis for the cap layer, which is preferably formed from silicon. In this case, the sacrificial layer, which is to be removed again later, serves for the temporary mechanical fixing of the movable, fragile, at least one mechanical functional element prior to the application, preferably growth, of the cap layer. To put it another way, the initially movable mechanical functional element is temporarily fixed by means of the sacrificial layer prior to the application of the cap layer, in which case the regions filled with the sacrificial layer, after the removal of the sacrificial layer, form cavities within which the functional elements can move. A method for capping a MEMS wafer which is embodied according to the concept of the disclosure makes it possible to test a MEMS wafer that has been fully processed, in particular apart from the metallization, prior to the capping, that is to say prior to the application of the sacrificial layer and the cap layer, insofar as no metallization is necessary for this purpose. Complete testing prior to the capping is possible if a test wafer with metallization is processed. One essential advantage of the MEMS wafer capped by the method proposed is, in addition to the testability prior to the capping, the smaller space requirement, both in a vertical direction and with regard to its areal extent. This can firstly be attributed to the fact that the combination of sacrificial layer and cap layer has a construction that is not as high as a separate capping wafer. Secondly, the smaller areal extent results from the fact that it is not necessary to provide lateral reserves for a seal glass connection or a eutectic bonding frame since the capping is directly connected to the MEMS wafer.

One development of the disclosure advantageously provides for the MEMS wafer to be metallization-free prior to the application of the sacrificial layer and of the cap layer. As will be explained later, the metallization is preferably applied after the application of the cap layer, directly to the cap layer and/or to a closure layer provided on the cap layer. In the case of this later metallization, the metal should be arranged in such a way that contact is made with desired regions of the MEMS wafer, such as the substrate plane and/or a so-called wiring plane formed from polysilicon, for example, in particular by means of the, preferably electrically conductive, cap layer.

An embodiment of the method in which the at least one movable mechanical functional element is tested for functionality prior to the capping process, that is to say prior to the application of the sacrificial layer, is especially preferred. Possible faults can therefore be identified as early as prior to the capping of the MEMS wafer.

One development of the disclosure advantageously provides for a sacrificial layer embodied as a silicon-germanium layer to be applied to the, in particular fully processed, MEMS wafer. The use of an LPCVD method or else of a PECVD method is particularly suitable for this purpose. In this case, the germanium proportion is adjustable and can be between a few and 100 atom percent according to the respective process. It is especially preferred that the sacrificial layer is planarized (smoothed), for example by means of CMP or a similar planarization process, in order to minimize the roughness and topography.

One development of the disclosure advantageously provides for the, preferably epitaxially grown, cap layer to be formed from silicon, in which case alternative, in particular growable, substances can also be used. In this case, the cap layer, in particular depending on the substrate, can be formed from monocrystalline and/or polycrystalline silicon. A polycrystalline silicon layer can optionally be used as the start layer.

An embodiment in which the cap layer or the start layer of the cap layer is not applied directly to the sacrificial layer, but rather to an intermediate layer already mentioned, is especially preferred. The at least one intermediate layer is especially preferably a diffusion barrier, which is preferably embodied in such a way that it prevents unintended interdiffusion of silicon and germanium between the start layer, the cap layer and the sacrificial layer. In this case, an embodiment in which said diffusion barrier, that is to say the at least one intermediate layer, is used as an HTO layer (high temperature oxide layer) is especially advantageous.

One development of the disclosure advantageously provides for the at least one intermediate layer, preferably the diffusion barrier, to be structured prior to the application or growth of the cap layer, preferably in such a way that at least one region of the MEMS wafer with which electrical contact is to be made later is uncovered. To put it another way, the intermediate layer is removed in partial regions, such that the cap layer, which preferably consists of silicon, has direct contact with at least one electrically conductive layer of the MEMS wafer.

One development of the disclosure advantageously provides for the cap layer to be planarized, preferably by means of CMP or a similar process.

It is especially preferred if the cap layer is structured, preferably after planarization, for example by means of the applicant's DRIE process, as it is called. In this case, the structuring is preferably effected in such a way that an access to the sacrificial layer is trenched in order subsequently to remove the sacrificial layer, as will be explained later, in particular by means of a $ClF_3$ gas bevel etching process.

As mentioned above, the structuring of the cap layer is preferably effected in such a way that the sacrificial layer is uncovered in at least one partial region in order to make the sacrificial layer accessible for a sacrificial layer removal process, preferably using $ClF_3$. By virtue of the high selectivity with respect to pure silicon, an attack of the at least one mechanical, freely movable functional element (functional structure) is not to be expected even without a protective layer.

Preferably, in one development of the method, after the sacrificial layer removal step, an antistiction layer (ASC layer) is applied, for example by means of an SIC deposition process, said layer protecting the functional element structures against an adhesive tendency. This process can optionally be utilized simultaneously for the closure and pressure inclusion of the at least one functional element.

As mentioned, the antistiction layer can be used as a closure layer. In this case, the closure layer has the task that the structures introduced into the cap layer, in particular for uncovering the sacrificial layer that is then to be removed, are finally closed again, such that the at least one functional element (functional structures) is completely encapsulated.

The pressure setting in at least one cavity which is formed by the removal of the sacrificial layer, and preferably accommodates the at least one functional element, can be realized by the setting of the system pressure during the application of the closure layer. Alternatively, the pressure setting can be effected by means of a subsequent gas diffusion method.

One development of the disclosure advantageously provides for at least one metallization to be applied to the, preferably previously structured, closure layer and/or to the cap layer, wherein the metallization is electrically conductively connected to corresponding connection regions of the MEMS wafer electrically conductively, preferably by means of the cap layer. Preferably, the metallization layer is applied in a structured fashion or is structured separately. The metallization preferably serves for electrically linking contact plungers.

The disclosure also leads to an encapsulated MEMS wafer, preferably produced by a method described above. The MEMS wafer is distinguished by a movable mechanical functional element (functional structure) and also a capping. The disclosure provides for the capping to comprise a grown cap layer, in particular composed of silicon.

One development of the disclosure advantageously provides for at least one metallization for making contact with the MEMS wafer to be arranged on the cap layer and/or on a, preferably structured, closure layer assigned to the cap layer. An embodiment in which the actual MEMS wafer has no metallization, such that the metallization is arranged exclusively on the capping, is especially preferred.

In order to avoid antistiction effects, one development of the disclosure advantageously provides for an antistiction layer to be provided on the at least one functional element (functional structure).

Further preference is given to an embodiment in which the cavities formed in the capping by the removal of a sacrificial layer are lined with a diffusion barrier layer, in particular an HTO layer, in which case it is also possible to realize an embodiment in which this initially optionally provided diffusion barrier layer was removed again.

BRIEF DESCRIPTION OF THE DRAWINGS

Further advantages, features and details of the disclosure will become apparent from the following description of a preferred exemplary embodiment of a method for encapsulating a MEMS wafer and with reference to the drawings, in which.

DETAILED DESCRIPTION

In the figures, identical components and elements having the same function are identified by the same reference sign.

Figure 1:
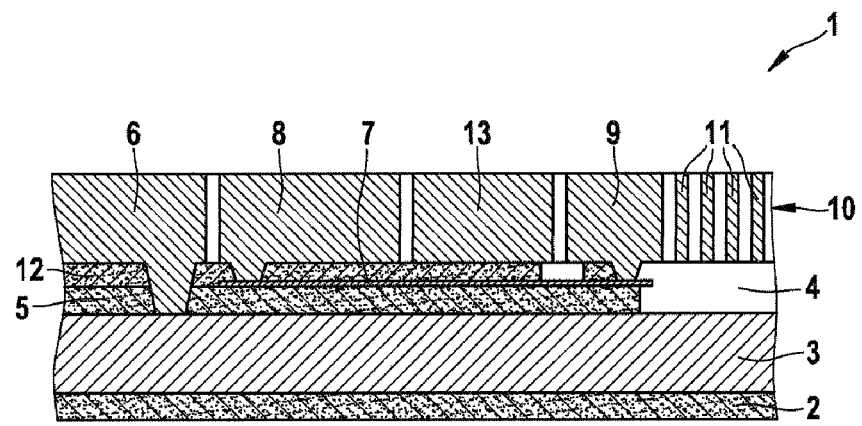
FIG. 1 to FIG. 10 show temporally successive production steps in the encapsulation of a MEMS wafer, a finished encapsulated MEMS wafer being shown in FIG. 10.

In FIG. 1, a MEMS wafer 1 that has been fully processed apart from an (Alu) metallization is shown as a basis for the capping method to be described below. The MEMS wafer 1, which is merely illustrated schematically, comprises a—in the plane of the drawing—lower carrier layer 2 composed of thermal oxide. In the plane of the drawing above the carrier layer 2, a substrate layer 3 composed of silicon is situated directly on the carrier layer 2. On that side of the substrate layer 3 which faces away from the carrier layer 2, a cavity 4 adjoins said substrate layer on the right in the plane of the drawing. A structured oxide layer 5 is provided on the left alongside the cavity 4. In a region on the left in the plane of the drawing, the oxide layer 5 is penetrated by an epitaxial silicon layer 6 in order to be able to be make contact with the substrate layer 3 later. The oxide layer 5 is directly adjoined by a so-called wiring plane 7 (contact-making intermediate layer), which electrically conductively connects a first region 8 of the epitaxial silicon layer 6 to a second region 9 of the silicon layer 6, wherein the second region 9 of the silicon layer 6 laterally directly adjoins a freely movable, mechanical functional element 10 (functional structure). A hollow space formed by the cavity 4 is situated below the functional element 10 and also between structure elements 11 of the functional element 10.

Directly adjacent to the wiring plane 7 composed of polysilicon is a further oxide layer 12, which electrically insulates the wiring plane 7 from a further region 13 of the epitaxial silicon layer 6 toward the top in the plane of the drawing. The regions 8 and 9 of the epitaxial silicon layer 6 penetrate through said (upper) oxide layer 12 and make contact with the electrically conductive wiring plane 7.

As is evident from FIG. 1, the MEMS wafer 1 in the form of a sensor is fully processed apart from a metallization. The MEMS wafer was preferably produced using so-called sacrificial layer technology. It can be discerned that the functional element 10 or the structure elements 11 of the functional element 10 are free. All functions with the limitation of the absent metallization are testable in this stage prior to the beginning of the capping method.

Figure 2:
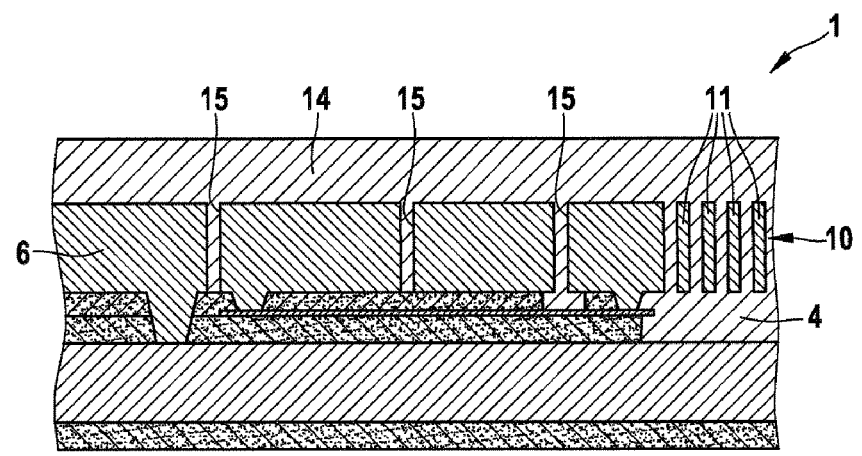

FIG. 2 shows a first step of the capping method. In this case, a sacrificial layer 14 composed of silicon-germanium is deposited onto the fully processed MEMS wafer 1 shown in FIG. 1 and is optionally planarized, for example by means of a CMP process. It can be discerned that the sacrificial layer 14 extends into trench channels 15 of the structured epitaxial silicon layer 6 and also into the cavity 4 and thus blocks the functional element 10 or the structure elements 11—that is to say that the latter are no longer free. Furthermore, the sacrificial layer 14 forms a topmost layer in sections in this method stage.

Optionally, prior to the application of the sacrificial layer, a diffusion barrier, for example composed of HTO, can be deposited, which prevents diffusion into the silicon layer 6 at high temperatures. Additionally or alternatively, a high-temperature-resistant antistiction coating can be applied, which with further preference simultaneously serves as a diffusion barrier.

Figure 3:
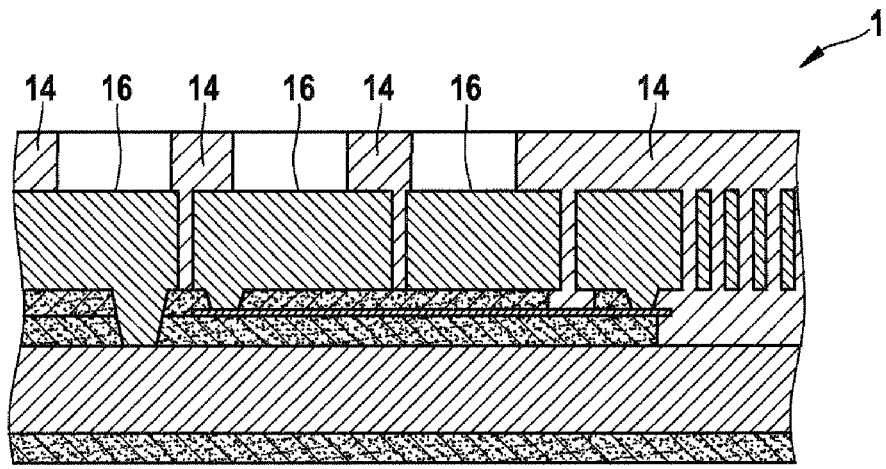

After a further capping step, the result shown in FIG. 3 is obtained. The sacrificial layer 14 is structured, such that alignment marks 16 for subsequent alignment were uncovered in the alignment region. Furthermore, the uncovered regions serve for the subsequent electrical linking of the MEMS wafer 1, in which a cap layer, which will be explained later, obtains direct contact with the epitaxial silicon layer 6 in the structured regions.

Figure 4:
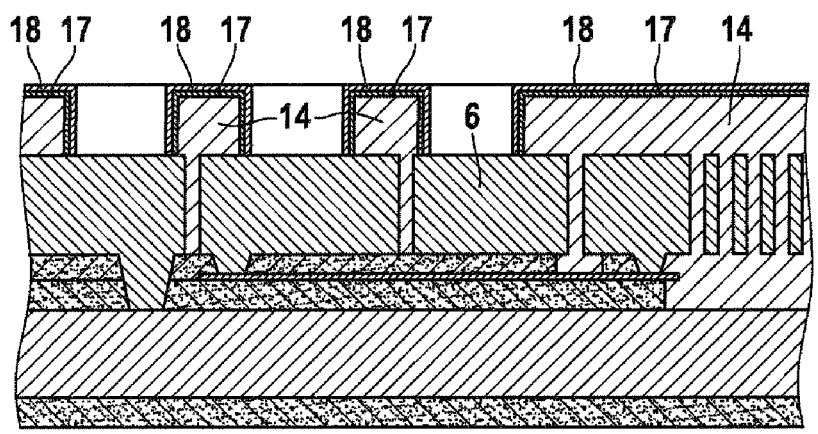

As a next optional capping step, the result of which is shown in FIG. 4, an intermediate layer 17 embodied as an HTO diffusion barrier is applied and structured, in such a way that the intermediate layer 17 is situated only on or at the sacrificial layer 14 and not on the epitaxial silicon layer 6.

After the deposition of the HTO diffusion barrier intermediate layer 17, in the exemplary embodiment shown, an LPCVD start polysilicon (start layer 18) is deposited, and preferably structured together with the intermediate layer 17, such that the start layer 18 is situated exclusively on the intermediate layer 17 or, in the case where an intermediate layer 17 is dispensed with, exclusively directly on the sacrificial layer 14. Preferably, structures of >30 μm are removed during the structuring.

Figure 5:
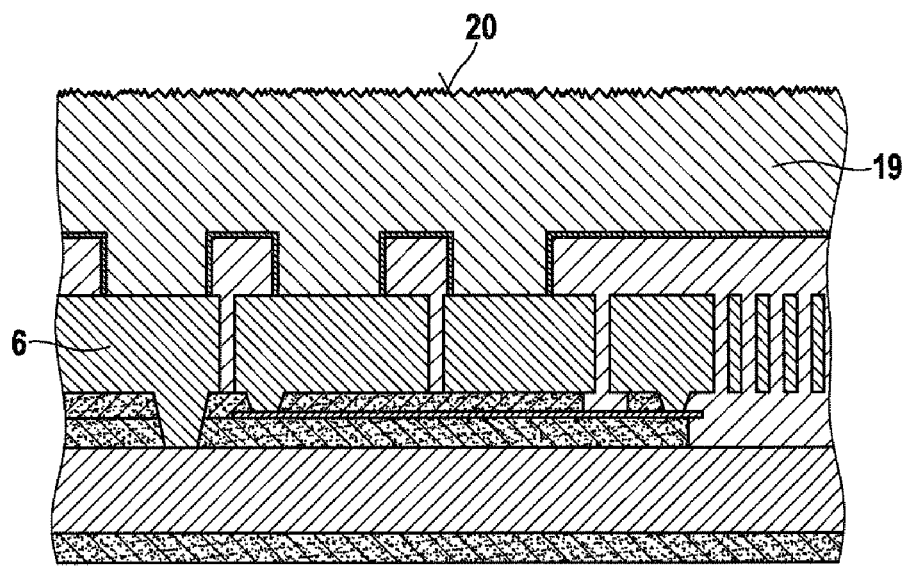

In a subsequent method step, a cap layer 19 composed of silicon is grown onto the start layer 18. The result is shown in FIG. 5. It can be discerned that the cap layer 19 in the structured regions of the intermediate layer 17 and of the sacrificial layer 14 has direct contact with the epitaxial silicon layer 6, that is to say is electrically conductively connected thereto. In this case, the cap layer 19 composed of silicon grows in polycrystalline fashion above the intermediate layer 17 in the plane of the drawing and in monocrystalline fashion above, i.e. in the contact region with respect to the epitaxial silicon layer 6.

Figure 6:
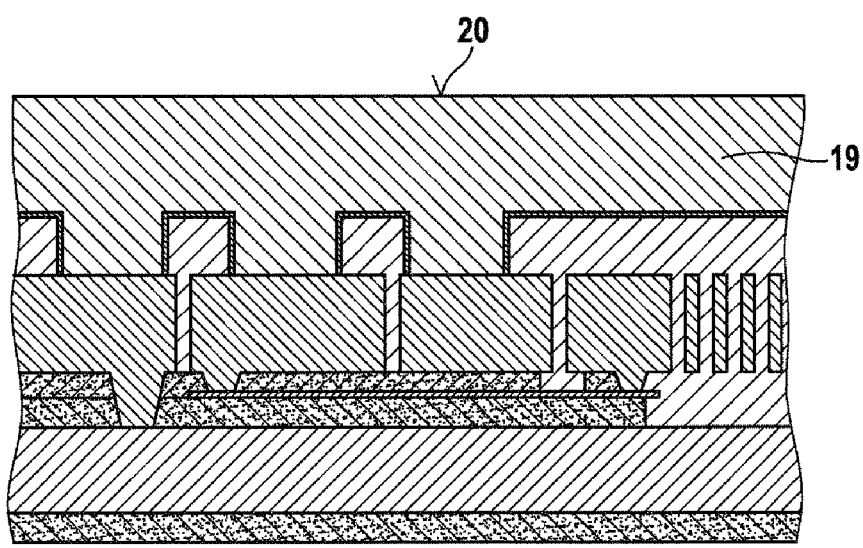

In a subsequent step, the surface 20 of the cap layer is planarized, for example by means of a CMP method. The result of this method step is shown in FIG. 6.

Figure 7:
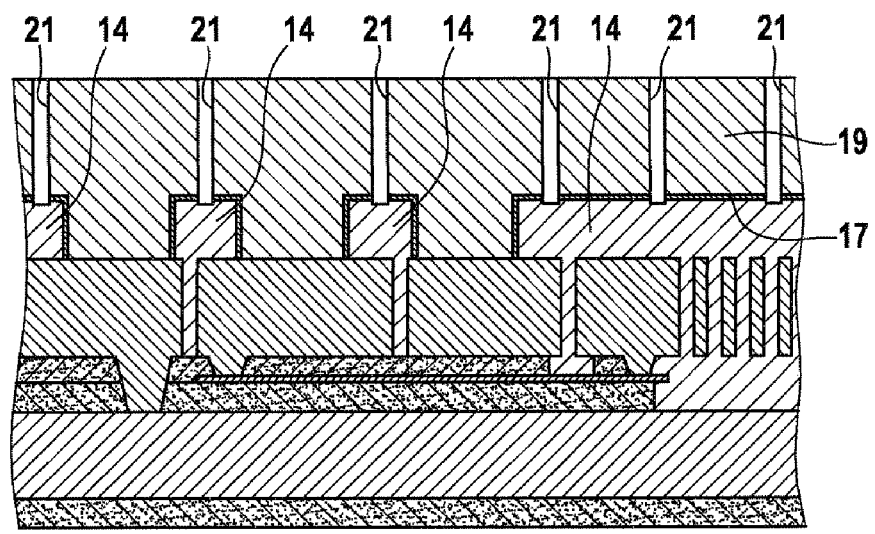

This is followed by structuring of the cap layer 19 by trenching. This results in the release structures 21 (trench channels) shown in FIG. 7, by means of which the sacrificial layer 14 is uncovered in regions, i.e. made accessible in the drawing from above in the plane of the drawing. It can be discerned that a plurality of release structures 21 are provided in a large sacrificial layer section on the right in the plane of the drawing.

The next method step involves the removal of the sacrificial layer 14, that is to say a so-called silicon-germanium release using $ClF_3$, which has a high selectivity with respect to silicon and therefore exclusively removes the sacrificial layer 14, as a result of which a multiplicity of cavities 22 that have not yet been closed are formed, in particular also around the functional element 10 or the structure elements 11, such that the latter can move freely again.

Figure 8:
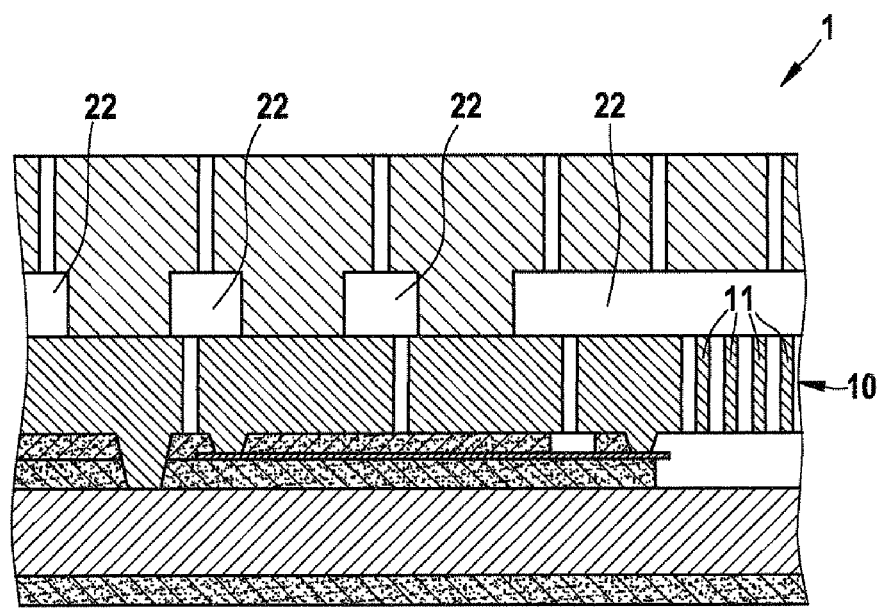
Figure 9:
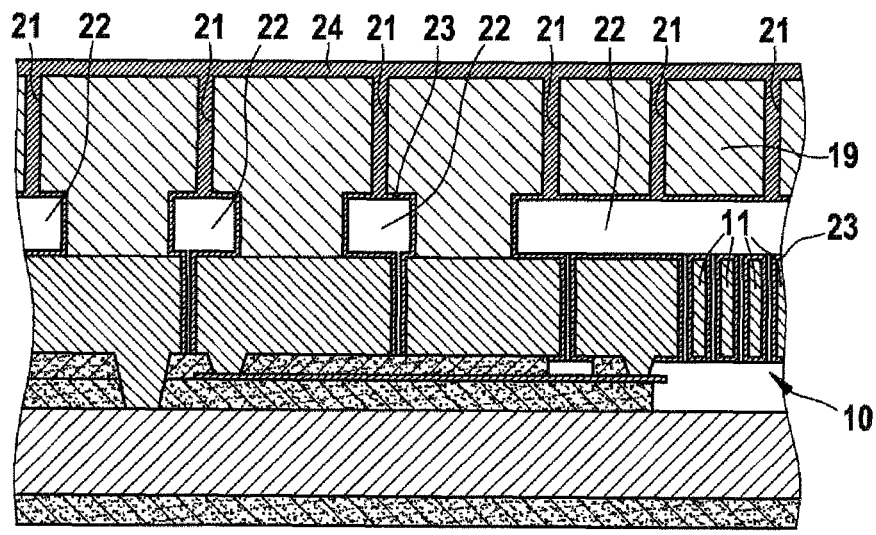

As is evident from FIG. 8, the intermediate layer 17 (diffusion barrier) provided on the sacrificial layer 14 is likewise removed, by the use of HF in the gas bevel in the present exemplary embodiment. Alternatively, it is also possible to leave the HTO diffusion barrier intermediate layer 17.

The next method step involves the deposition (ASC deposition) of an antistiction layer 23, which lines the cavities 22 and also coats the structure elements 11 of the functional element 10. In this case, the antistiction layer 23 can be applied in an amount such that it simultaneously serves as a closure layer 24, which covers the cap layer 19 and closes the release structures 21 and thus seals the cavities 22. Alternatively, a closure layer 24 separate from the antistiction layer 23 can be provided, which serves for closing the release structure 21 and thus for sealing the cavities 22 or for hermetically isolating the structure elements 11 of the functional element 10.

The separate closure layer 24 can be formed from polysilicon, for example.

The pressure setting of the gas pressure in the cavities 22 can either be set by setting the ambient pressure during the application of the closure layer. Alternatively, gas diffusion into the cavities 22 can be realized in a later step at high temperatures.

In a further method step, the closure layer 24 forming a covering layer is structured, in such a way that the grown cap layer 19 (epitaxial layer) is uncovered in order, in a subsequent metallization step, to be able to apply metallizations 25 which make electrically conductive contact with the cap layer 19. The metallization 25 on the left in the plane of the drawing serves for making electrical contact with the substrate layer 3 via the cap layer 19 and the epitaxial silicon layer 6 penetrating through the oxide layers 5, 12. The metallization 25 on the right in the plane of the drawing serves for making electrical contact with the so-called wiring plane 7 and thus for making electrical contact with the region 9 of the epitaxial silicon layer 6 arranged directly adjacent to the functional element 10. For this purpose, both the region 9 of the silicon layer 6 and the region 8 arranged below and at a distance from the metallization 25 (connection region) penetrate through the upper oxide layer 12 and makes contact directly with the wiring plane 7 (also cf. FIG. 10).

Figure 10:
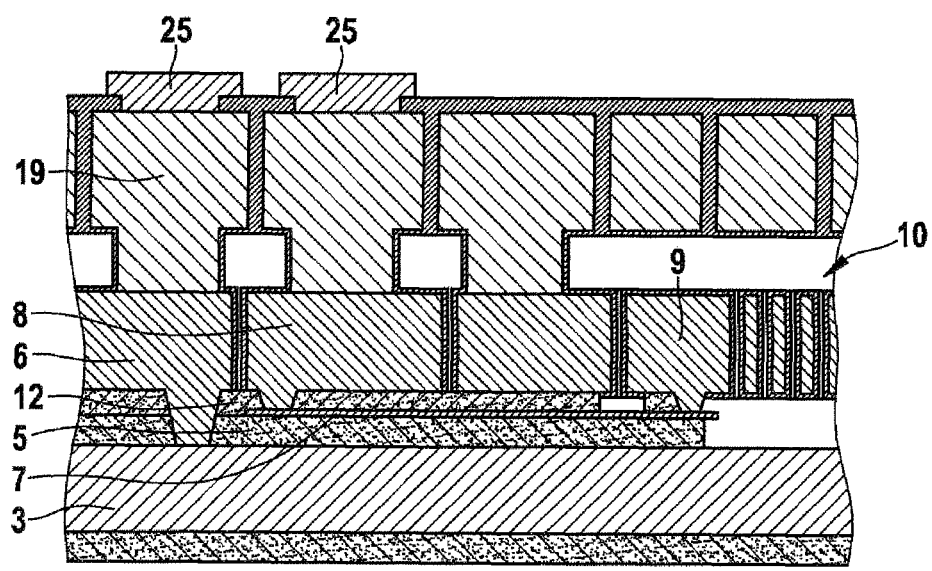

The metallization 25 is firstly applied as a whole-area layer on the closure layer 24 and thereupon structured, such that the metallizations 25 (metallization sections) shown in FIG. 10 are obtained.

In a final step (not shown), it is possible to produce contact regions to the metallizations 25, for example by means of contact wires.

The invention claimed is:

1. A method for capping a MEMS wafer comprising:
   providing a wafer with at least one mechanical functional element;
   fixing the at least one mechanical functional element with a sacrificial layer;
   epitaxially growing a cap layer onto the sacrificial layer and/or at least one intermediate layer applied to the sacrificial layer; and
   testing the at least one mechanical functional element for functionality prior to epitaxially growing the cap layer.

2. The method as claimed in claim 1, wherein the MEMS wafer is metallization-free prior to fixing the at least one mechanical functional element with the sacrificial layer and epitaxially growing the cap layer.

3. A method for capping a MEMS wafer comprising:
providing a wafer with at least one mechanical functional element;
fixing the at least one mechanical functional element with a sacrificial layer;
epitaxially growing a cap layer onto the sacrificial layer and/or at least one intermediate layer applied to the sacrificial layer; and
applying an antistiction layer by an SIC deposition process, such that the at least one mechanical functional element is coated with the antistiction layer.

4. The method as claimed in claim 1, wherein the sacrificial layer is applied as a silicon-germanium layer by means of an LPCVD or PECVD method.

5. The method as claimed in claim 1, wherein the cap layer is formed from monocrystalline and/or polycrystalline silicon.

6. The method as claimed in claim 1, wherein a diffusion barrier, in the form of an HTO layer, is formed on at least one intermediate layer.

7. The method as claimed in claim 1, wherein the at least one intermediate layer is structured prior to growing the cap layer, such that at least one region of the MEMS wafer with which electrical contact may be made later is uncovered.

8. The method as claimed in claim 1, wherein the cap layer is planarized by CMP.

9. The method as claimed in claim 1, wherein the cap layer is trenched, such that the sacrificial layer is uncovered in sections.

10. The method as claimed in claim 1, wherein the sacrificial layer is removed at least partly, by a $ClF_3$ gas etching process, such that the functional element is movable again.

11. The method as claimed in claim 3 further comprising:
testing the at least one mechanical functional element for functionality prior to epitaxially growing the cap layer.

12. The method as claimed in claim 1, wherein a closure layer is applied to the cap layer by an ASC deposition.

13. The method as claimed in claim 1, wherein a pressure setting in at least one cavity formed by a removal of the sacrificial layer is implemented by a system pressure during the method or by gas diffusion.

14. The method as claimed in claim 12, wherein at least one metallization for making contact with the MEMS wafer is applied to the closure layer and/or to the cap layer.

15. A capped MEMS wafer comprising:
at least one freely movable mechanical functional element;
a capping including a grown cap layer; and
an antisticition layer on the at least one freely movable mechanical functional element.

16. The MEMS wafer as claimed in claim 15, further comprising:
at least one metallization arranged on the cap layer and/or on a structured closure layer arranged on the cap layer.

17. The MEMS wafer as claimed in claim 15, further comprising:
at least one cavity formed in the capping and lined with a diffusion barrier.

18. A method for capping a MEMS wafer comprising:
providing a wafer with at least one mechanical functional element;
fixing the at least one mechanical functional element with a sacrificial layer;
epitaxially growing a cap layer onto the sacrificial layer and/or at least one intermediate layer applied to the sacrificial layer;
trenching the cap layer, such that the sacrificial layer is uncovered in sections;
removing the sacrificial layer at least partly by a $ClF_3$ gas etching process such that the functional element is movable again; and
applying a closure layer to the cap layer by an antistiction layer deposition.

* * * * *